US012685041B2

(12) United States Patent
Deckers

(10) Patent No.: US 12,685,041 B2
(45) Date of Patent: Jul. 14, 2026

(54) METHODS OF FORMING SUPERLATTICE STRUCTURES USING NANOPARTICLES

(71) Applicant: ASM IP Holding, B.V., Almere (NL)

(72) Inventor: Jan Deckers, Kessel-Lo (BE)

(73) Assignee: ASM IP Holding B.V., Almere (NL)

( * ) Notice: Subject to any disclaimer, the term of this patent is extended or adjusted under 35 U.S.C. 154(b) by 555 days.

(21) Appl. No.: 18/304,067

(22) Filed: Apr. 20, 2023

(65) Prior Publication Data

US 2023/0352300 A1     Nov. 2, 2023

Related U.S. Application Data

(60) Provisional application No. 63/335,497, filed on Apr. 27, 2022.

(51) Int. Cl.
| | |
|---|---|
| *H01L 21/02* | (2006.01) |
| *C30B 25/16* | (2006.01) |
| *C30B 29/06* | (2006.01) |
| *C30B 29/52* | (2006.01) |
| *C30B 29/68* | (2006.01) |

(Continued)

(52) U.S. Cl.
CPC ........ *H10P 14/3252* (2026.01); *C30B 25/165* (2013.01); *C30B 29/06* (2013.01); *C30B 29/52* (2013.01); *C30B 29/68* (2013.01); *C30B 33/12* (2013.01); *H10P 14/24* (2026.01); *H10P 14/3206* (2026.01); *H10P 14/3211* (2026.01); *H10P 14/3256* (2026.01); *H10P 14/3406* (2026.01); *H10P 14/3411* (2026.01); *H10P 14/3458* (2026.01); *H01J 37/321* (2013.01); *H01J 2237/3321* (2013.01)

(58) Field of Classification Search
CPC ......... H01L 21/02507; H01L 21/02444; H01L 21/0245; H01L 21/02513; H01L 21/02527; H01L 21/02532; H01L 21/02598; H01L 21/0262; H01L 21/02123; H01L 21/02274; H01L 21/02293; C30B 25/165; C30B 29/06; C30B 29/52; C30B 29/68; C30B 33/12; C30B 25/105; C30B 25/22; C30B 25/16; C30B 25/186; C30B 29/08; C30B 25/02; C30B 25/08; H01J 37/321; H01J 2237/3321; H10D 62/111; C23C 16/24; C23C 16/26; C23C 16/4408; C23C 16/50
See application file for complete search history.

(56) References Cited

U.S. PATENT DOCUMENTS

| | | | | |
|---|---|---|---|---|
| 10,903,073 | B2 * | 1/2021 | Kim | ...................... H01L 21/683 |
| 11,688,603 | B2 * | 6/2023 | Khazaka | ............. H01L 21/0245 257/616 |

(Continued)

OTHER PUBLICATIONS

Han et al. ( 2005 International Semiconductor Device Research Symposium, Bethesda, MD, USA, 2005, pp. 440-441) doi: 10.1109/ISDRS.2005.1596175. (Year: 2005).*

(Continued)

*Primary Examiner* — Christine S. Kim
*Assistant Examiner* — Nathalie R Fayette
(74) *Attorney, Agent, or Firm* — Banner & Witcoff, Ltd.

(57) ABSTRACT

Methods and systems for forming structures including a superlattice of silicon-containing epitaxial layers using nanoparticles. Exemplary methods can include forming nanoparticles in situ and depositing the nanoparticles onto a substrate surface to thereby form the epitaxial layers.

21 Claims, 4 Drawing Sheets

(51) Int. Cl.

| | |
|---|---|
| *C30B 33/12* | (2006.01) |
| *H01J 37/32* | (2006.01) |
| *H10P 14/20* | (2026.01) |
| *H10P 14/24* | (2026.01) |

(56) References Cited

U.S. PATENT DOCUMENTS

| | | | | |
|---|---|---|---|---|
| 2006/0269690 A1* | 11/2006 | Watanabe | .............. | B82Y 30/00 |
| | | | | 427/248.1 |
| 2011/0151142 A1* | 6/2011 | Seamons | ............. | C23C 16/4401 |
| | | | | 427/579 |
| 2021/0292902 A1* | 9/2021 | Kajbafvala | ............. | C30B 25/10 |
| 2021/0408009 A1* | 12/2021 | Zheng | ................ | H10D 84/0167 |

OTHER PUBLICATIONS

Sheng et al., Journal of Crystal Growth, vol. 253, Issues 1â4 (2003) pp. 77-84, ISSN 0022-0248. https://doi.org/10.1016/S0022-0248(03)01018-2. (Year: 2003).*

Epitaxial growth of silicon and germanium on (100)-oriented crystalline substrates by RF PECVD at 175 oC. M. Labrune et al. EPJ Photovoltaics 3, 30303 (2012).

* cited by examiner

METHODS OF FORMING SUPERLATTICE STRUCTURES USING NANOPARTICLES

FIELD OF THE INVENTION

The present disclosure generally relates to methods suitable for forming electronic device structures, to systems for performing the methods, and to structures formed using the methods. More particularly, the disclosure relates to methods and systems for forming structures that include silicon-containing epitaxial layers and lattice structures including the same.

BACKGROUND OF THE DISCLOSURE

Recently, three-dimensional devices, such as gate-all-around (GAA) or nanowire devices, have been developed in an effort to form high-performance devices with increased device density, with improved performance, and/or at lower costs.

During the formation of GAA devices, a stacked structure or superlattice of alternating layers comprising silicon germanium (SiGe layers) and layers comprising silicon (Si layers) can be formed by sequentially epitaxially growing the SiGe and Si layers on a surface of a substrate. Portions of these layers can be etched to form (e.g., silicon) wires that can form channel regions of GAA devices.

For some applications, such as formation of three-dimensional DRAM devices, it is desirable to have a relatively thick (e.g., 10-20 μm) superlattice. Typical epitaxial deposition processes are relatively slow and time consuming. Therefore, forming such superlattices with typical processes can lead to high cost of ownership.

Accordingly, improved methods of forming superlattice structures, such as structures including epitaxial Si layers and epitaxial SiGe layers, are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods of forming structures, to structures and devices formed using such methods, and to apparatus for performing the methods and/or for forming the structures and/or devices. While the ways in which various embodiments of the disclosure address drawbacks of prior methods and structures are discussed in more detail below, in general, exemplary methods include techniques for relatively rapidly forming superlattice structures comprising epitaxial layers of two or more different compositions, which allows for relatively low cost of ownership for forming devices manufactured using such superlattice structures.

In accordance with exemplary embodiments of the disclosure, methods of forming a superlattice structure are disclosed. Exemplary methods include providing a substrate within a reaction chamber, forming a first silicon-containing epitaxial layer by providing first silicon-containing nanoparticles to a surface of the substrate, forming a second silicon-containing epitaxial layer overlying the first silicon-containing epitaxial layer by providing second silicon-containing nanoparticles, and repeating the steps of forming the first silicon-containing epitaxial layer and forming the second silicon-containing epitaxial layer to form a superlattice. In accordance with examples of these embodiments, a composition of the first silicon-containing epitaxial layer differs from a composition of the second silicon-containing epitaxial layer. The first silicon-containing epitaxial layer can be or include, for example, an intrinsic or doped silicon layer. The second silicon-containing epitaxial layer can be or include silicon germanium. The first silicon-containing nanoparticles and/or the second silicon-containing nanoparticles can be formed within the reaction chamber. For example, the first silicon-containing nanoparticles and/or the second silicon-containing nanoparticles can be formed using a plasma-enhanced process, such as a plasma-enhanced chemical vapor deposition process. The plasma-enhanced chemical vapor deposition process can include, for example, forming a plasma using an inductively-coupled plasma apparatus. In accordance with further examples of these embodiments, the method can include a purge step between the steps of forming the first silicon-containing epitaxial layer and forming the second silicon-containing epitaxial layer. Additionally or alternatively, the method can include forming a carbon-containing layer between the steps of forming the first silicon-containing epitaxial layer and forming the second silicon-containing epitaxial layer and/or between the steps of forming the second silicon-containing epitaxial layer and forming the first silicon-containing epitaxial layer. In accordance with further examples, a method can include etching the superlattice to form a superlattice feature. In such cases, a method can further include selectively etching one or more of the first silicon-containing epitaxial layer and the second silicon-containing epitaxial layer.

In accordance with further exemplary embodiments of the disclosure, a structure (e.g., a superlattice structure) is formed using a method as described herein. The structure can include, for example, a plurality of layers comprising silicon and a plurality of layers comprising silicon germanium.

In accordance with yet additional examples of the disclosure, a system to perform a method as described herein and/or to form a structure, device, or portion of either is disclosed.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
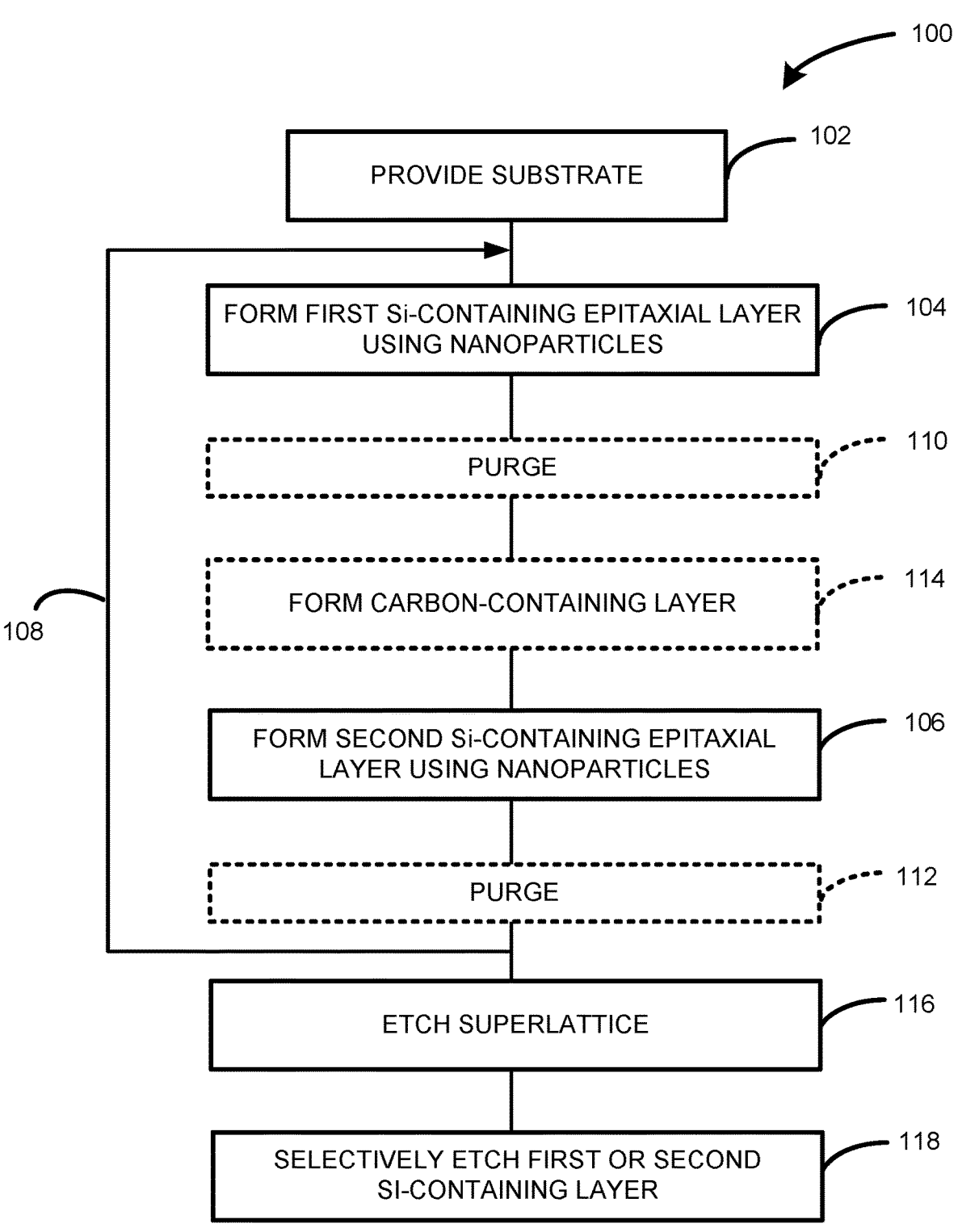
FIG. 1 illustrates a method in accordance with exemplary embodiments of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, and reactor systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. Unless otherwise noted, the exemplary embodiments or components thereof may be combined or may be applied separate from each other.

As set forth in more detail below, various embodiments of the disclosure provide methods for forming structures suitable for forming electronic devices. Exemplary methods can be used to, for example, form superlattice structures that include a superlattice of multiple silicon-containing epitaxial layers. Such superlattice structures can be used in the fabrication of, for example, gate-all around (GAA) or nanowire devices, which are suitable for, for example, DRAM applications.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, such as a multi-port injection system, or the like, can be used for, e.g., sealing the reaction space, and can include a seal gas, such as a noble gas. In some cases, the term "precursor" can refer to a compound that participates in the chemical reaction that produces another compound or nanoparticle. The term "inert gas" can refer to a gas that does not take part in a chemical reaction and/or does not become a part of a film or nanoparticle to an appreciable extent. Exemplary inert gases include He, Ar, $H_2$, $N_2$, and any combination thereof.

The term "carrier gas" as used herein may refer to a gas that is provided to a reactor chamber together with one or more precursors. For example, a carrier gas may be provided to the reactor chamber together with one or more of the precursors used herein. Exemplary carrier gases include $N_2$, $H_2$, and noble gases such as He, Ne, Kr, Ar, and Xe.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as a Group II-VI or Group Ill-V semiconductor, and can include one or more layers overlying or underlying the bulk material. Further, the substrate can include various features, such as recesses, protrusions, and the like formed within or on at least a portion of a layer or surface of the substrate.

As used herein, the term "epitaxial layer" can refer to a substantially single crystalline layer upon an underlying substantially single crystalline substrate or layer.

As used herein, the term "chemical vapor deposition" can refer to any process wherein a gas-phase reaction takes place to, for example, form nanoparticles.

As used herein, the term "silicon germanium" can refer to a semiconductor material comprising silicon and germanium and can be represented as $Si_{1-x}Ge_x$ wherein $1 \geq x \geq 0$, or

4

$0.8 \geq x \geq 0.1$, or $0.6 \geq x \geq 0.2$, or materials comprising silicon and germanium having compositions as set forth herein.

As used herein, the term "film" and/or "layer" can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, the term "monocrystalline" may refer to a material that includes a substantial single crystal, i.e., a crystalline material that displays long range ordering. It should, however, be appreciated that a monocrystalline material may not be a perfect single crystal but may comprise various defects, stacking faults, atomic substitutions, and the like, as long as the monocrystalline material exhibits long range ordering.

As used herein, the term "non-monocrystalline" may refer to a material that does not comprise a substantial single crystal, i.e., a material which displays either short range ordering or no ordering of the crystalline structure. Non-monocrystalline materials may comprise polycrystalline materials which may display short range ordering and amorphous materials which may display substantially no ordering of the crystalline structure.

As used herein, a "structure" can include a substrate as described herein. Structures can include one or more layers (e.g., a superlattice) overlying the substrate, such as one or more layers formed according to a method as described herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

As used herein, the term "nanoparticle" refers to particles having a dimension (e.g., a cross section, a height, a width, and/or a length) from about 1 nm to about 100 nm or about 1 nm to about 50 nm or about 1 nm to about 20 nm.

Turning now to the figures, FIG. 1 illustrates a method 100 in accordance with exemplary embodiments of the disclosure. Method 100 includes the steps of providing a substrate within a reaction chamber (step 102), forming a first silicon-containing epitaxial layer by providing first silicon-containing nanoparticles to a surface of the substrate (step 104), and forming a second silicon-containing epitaxial layer overlying the first silicon-containing epitaxial layer by providing second silicon-containing nanoparticles (step 106). Steps 104 and 106 can be repeated (loop 108) a number of times as desired to form a stacked (e.g., superlattice) structure comprising one of more first layers alternating with one or more second layers. In accordance with examples of the disclosure, steps 104 and 106 can be repeated about 10 to about 3000, about 50 to about 1000, or about 1000 to 3000 times. Although illustrated with step 104 preceding step 106, the order of these steps may be reversed.

Further, regardless of which step is first, either step 104 or 106 may be the last of such steps, such that a top layer of the superlattice structure can include a first layer or a second layer.

As illustrated, method 100 can also include purge steps (steps 110, 112). Additionally or alternatively, method 100 can include forming a carbon-containing layer (step 114). Additionally or alternatively, method 100 can include etch steps (steps 116, 118).

During step 102, a substrate is provided within a reaction chamber. The substrate can include, for example, a surface comprising a monocrystalline silicon-containing material. The monocrystalline silicon-containing material can be bulk silicon substrate material or a layer, such as a silicon layer or a silicon germanium layer.

As a non-limiting example, the reaction chamber used during step 102 may comprise a reaction chamber of a chemical vapor deposition (e.g., epitaxial) system. For example, the system can include a cold wall epitaxial reaction chamber. The system may further include plasma formation apparatus—e.g., a power source and coils and/or electrodes. However, it is also contemplated that other reaction chambers and alternative chemical vapor deposition systems may also be utilized to perform the embodiments of the present disclosure. The reaction chamber can be a stand-alone reaction chamber or part of a cluster tool.

Step 102 can include heating the substrate to a desired deposition temperature within the reaction chamber. In some embodiments of the disclosure, step 102 includes heating the substrate to a temperature of less than approximately 1100° C., or to a temperature of less than approximately 850° C., or to a temperature of less than approximately 700° C., or to a temperature of less than approximately 650° C., or to a temperature of less than approximately 600° C., or to a temperature of less than approximately 550° C., or to a temperature of less than approximately 500° C., or to a temperature of less than approximately 450° C., or to a temperature of less than approximately 400° C., or even to a temperature of less than approximately 300° C. For example, in some embodiments of the disclosure, heating the substrate to a deposition temperature may comprise heating the substrate to a temperature between approximately 400° C. and approximately 1100° C. or approximately 400° C. and approximately 600° C.

By way of examples, a substrate can be heated with infrared lamps, which can be exterior of the reaction chamber, by heating a susceptor supporting the substrate. The substrate can be relatively transparent to the IR radiation, such that the radiation passes through the substrate and heats the susceptor below. The susceptor can absorb the IR radiation convert the IR radiation to heat, such that the heated susceptor heats the substrate to a desired temperature, such as a temperature noted above. Additionally or alternatively, a substrate support can be heated using a susceptor heater (e.g., one or more resistive heaters). Additionally or alternatively, a process gas and/or a heat exchanger can be used to heat the substrate. In accordance with alternative examples of the disclosure, localized energy can be provided to a substrate surface to selectively form one or more of the first silicon-containing epitaxial layer and the second silicon-containing epitaxial layer.

In addition to controlling the temperature of the substrate, a pressure within the reaction chamber may also be regulated. For example, in some embodiments of the disclosure, the pressure within the reaction chamber during step 102 may be less than 760 Torr, or less than 350 Torr, or less than 100 Torr, or less than 50 Torr, or less than 25 Torr, or less than 10 Torr, or even less than 5 Torr. In some embodiments, the pressure in the reaction chamber may be between 5 Torr and 760 Torr, between 10 Torr and 200 Torr, or between 10 Torr and 100 Torr. A temperature and/or pressure for steps 104 and/or 106 can be the same or similar to the temperature and/or pressure of step 102.

Step 104 of forming a first silicon-containing epitaxial layer by providing first silicon-containing nanoparticles to a surface of the substrate can include forming the first silicon-containing nanoparticles in situ (within the reaction chamber) or flowing nanoparticles to the reaction chamber. For example, the step of providing the first silicon-containing nanoparticles can include forming the first silicon-containing nanoparticles within the reaction chamber using, for example, a first plasma-enhanced chemical vapor deposition process, in which nanoparticles are formed and the nanoparticles subsequently deposit onto the surface of the substrate to form the first silicon-containing epitaxial layer.

The step of forming the first silicon-containing epitaxial layer can include, for example, forming an intrinsic or doped silicon layer. In the case of forming an intrinsic silicon layer, the first silicon-containing nanoparticles can be formed, for example, by providing a silicon precursor to the reaction chamber and forming a plasma within the reaction chamber. The plasma can be a direct or an indirect plasma. A reactant, such as hydrogen or the like, and/or a noble gas can also be provided to the reaction chamber. Any combination of one or more of the silicon precursor, the reactant (if used), the noble gas, and the power used to form the plasma can be pulsed. When pulsed, a duration of a precursor pulse can be between about 0.01 and about 10 or about 0.1 and about 1.0 seconds; a duration of a reactant pulse can be between about 0.01 and about 10 or about 0.1 and about 1 seconds; a duration of a noble gas pulse can be between about 0.001 and about 1.0 or about 0.01 and about 0.1 seconds; a duration of a power pulse can be between about 1 microsecond and about 1 second or between about 100 microseconds and about 10 milliseconds.

The plasma power can have a frequency between about 100 kHz and about 1 GHz. In some cases, plasma power at multiple frequencies can be used to produce a plasma. In some cases, the plasma power can be a radio frequency power, a microwave power, or both. In some cases, the plasma power can have a base frequency of 13.56 MHz, 27 MHz, or both. A wave shape of the plasma power can be a sinusoidal or non-sinusoidal shape. Examples of non-sinusoidal shapes include square, triangular, sawtooth, and the like.

In addition to plasma power, a bias can be applied to a substrate support or susceptor. For example, a direct current voltage source can be used to provide, for example, a negative bias to the substrate support to attract positively charged nanoparticles toward the substrate. Additionally or alternatively, an alternating bias (e.g., from an alternating current source) can be applied to the substrate support. In some cases, a bias may not be applied to the substrate support. In these cases, the method may rely on the nanoparticles being mostly positively charged and the substrate support generally being inherently negatively biased.

To form the first silicon-containing nanoparticles within the reaction chamber, a partial pressure of the silicon precursor may be relatively high. For example, the partial pressure can be between about 0.01 and about 10 or between about 0.1 and about 1.0 Torr or can be between about 0.5 and about 5 Torr.

When forming the first silicon-containing epitaxial layer comprises forming a doped silicon layer, a dopant precursor can be provided to the reaction chamber during the step of forming the first silicon-containing epitaxial layer. For example, the dopant precursor can be provided in an overlapping manner with the silicon precursor, such that doped silicon nanoparticles are formed and subsequently deposited onto the surface of the substrate. For example, both the silicon and dopant precursors can be provided to the reaction chamber for substantially the same period.

Exemplary silicon precursors suitable for forming the first silicon-containing nanoparticles include silanes and silicon halides. In some embodiments, the silicon halide compound can include, for example, a silicon halide having the general formula given as: $Si_xW_yH_z$, wherein "W" is a halide selected from the group consisting of fluorine (F), chlorine (Cl), bromine (Br), and iodine (I), "x" and "y" are integers greater than zero, and "z" is an integer greater than or equal to zero. For example, x can be between 1 and 4, y can be between 1 and 2x+2, and z can be between 0 and 2x+2−y. In some embodiments, the silicon halide precursor may comprise a silane, such as a silane having a formula $Si_xH_{(2x+2)}$. Byway of examples, the silicon precursor can be or include one or more of silicon tetrachloride ($SiCl_4$), trichloro-silane ($SiCl_3H$), dichlorosilane ($SiCl_2H_2$), monochlorosilane (Si-$ClH_3$), hexachlorodisilane (HCDS), octachlorotrisilane (OCTS), a silicon iodide, or a silicon bromide.

In accordance with other examples, the silicon precursor can include an amino-based precursor, such as hexakis (ethylamino)disilane (AHEAD), SiH[N(CH$_3$)$_2$]$_3$(3DMASi), BDEAS (bis(diethylamino)silane), di-isopropylaminosilane; or an oxysilane-based precursor, such as tetraethoxysilane $Si(OC_2H_5)_4$. In some cases, the silicon precursor can include two or more precursors, such as, for example, a halogenated precursor (e.g., a silicon halide compound noted above) and a silane precursor.

Exemplary dopant precursors include typical n-type and p-type dopants, such as arsine, phosphine, and the like.

During step 104, first silicon-containing nanoparticles are provided to the substrate surface. As the nanoparticles contact the substrate surface, islands of first silicon-containing material may form on the substrate surface and eventually coalesce into a continuous first silicon-containing epitaxial layer. The first silicon-containing epitaxial layer may be monocrystalline and serve as a template for further epitaxial layers (e.g., formed during step 106 and as repeated during loop 108). In some cases, the entire first layer may be monocrystalline. In some cases, the first layer can form as non-monocrystalline material in some areas.

A thickness of the first silicon-containing epitaxial can be between greater than zero or about 2 nm and about 10 nm, between about 2 nm and about 20 nm, or between about 2 nm and about 100 nm.

Step 106 of forming a second silicon-containing epitaxial layer overlying the first silicon-containing epitaxial layer by providing second silicon-containing nanoparticles can be similar to step 104, except a composition of the first silicon-containing epitaxial layer differs from a composition of the second silicon-containing epitaxial layer. The differing compositions of the first silicon-containing epitaxial layer and the second silicon-containing epitaxial layer can allow one of the layers to be selectively etched relative to the other of the first silicon-containing epitaxial layer and the second silicon-containing epitaxial layer. Step 106 can include, for example, forming a silicon germanium layer.

As with step 104, step 106 can include forming the second silicon-containing nanoparticles in situ (e.g., using a second plasma-enhanced chemical vapor deposition process) or providing the second silicon-containing nanoparticles to the reaction chamber. Further, step 106 can include initially forming an island of second silicon-containing material, which can coalesce to form a monocrystalline second silicon-containing epitaxial layer.

Step 106 can be performed in the same reaction chamber used during step 104. Alternatively, step 106 can be performed in another reaction chamber, such as another reaction chamber in the same cluster tool as the reaction chamber used during step 104 or of another reactor system. A temperature and/or pressure for step 106 can be the same or similar to the temperature and/or pressure described above in connection with step 102.

When forming the second silicon-containing nanoparticles, the second silicon-containing nanoparticles can be formed in a manner similar to the manner described above. For example, a silicon precursor, a dopant precursor (if any), a germanium precursor, and optionally an inert gas and/or a reactant can be provided to the reaction chamber, and a plasma can be formed within the reaction chamber to thereby form nanoparticles comprising second silicon-containing material, such as silicon germanium. In accordance with other examples of the disclosure, other silicon compositions or alloys may be formed or used as the first or second silicon-containing nanoparticles or the first or second silicon-containing epitaxial layer.

The silicon precursor, reactant (if any), and noble gas can be the same or similar to those described above in connection with step 104. Exemplary germanium precursors include germanes, such as germane (GeH$_4$), digermane (Ge$_2$H$_6$), trigermane (Ge$_3$H$_8$), or germylsilane (GeH$_6$Si), and halogen compounds, such as GeBr$_4$ or other suitable germanium-containing precursor. By way of particular examples, the germanium precursor can include one or more of germane and germanium tetrachloride (GeCl$_4$) or GeCl$_x$H$_{4-x}$.

The plasma power and partial pressure of the silicon precursor can be as noted above. Further, during step 106, one or more of the silicon precursor, any reactant, any noble gas, and/or the plasma power can be pulsed as described above. Further, the substrate or substrate support can be biased—or not—as noted above.

When forming second silicon-containing nanoparticles comprising silicon germanium, volumetric flow rates and flow ratios of the silicon precursor and the germanium precursor can vary in accordance with desired composition of the second layer.

Exemplary second silicon-containing epitaxial layers can include about 70 to about 80 atomic percent, or about 70 to about 90 atomic percent, or about 70 to about 99 atomic percent silicon and/or about 1 to about 30 atomic percent, or about 5 to about 20 atomic percent, or about 15 to about 30 atomic percent or about 20 to about 30 atomic percent germanium. In some embodiments, the germanium content within the second silicon-containing epitaxial layer may not be constant, but rather may be varied, such that the germanium content (and/or other component) may have a graded composition within the first layer. The grading can be accomplished by, for example, manipulating a flowrate of one or more of the silicon precursor and the germanium precursor during in situ formation of the second silicon-containing nanoparticles.

A thickness of the second silicon-containing epitaxial layer formed during step 106 can be between greater than zero or about 2 nm and about 4 nm, between about 2 nm and about 10 nm, between about 2 nm and about 20 nm, or between about 2 nm and about 100 nm.

In some cases, a dilution gas or an inert gas, or a reactant gas, such as hydrogen, can be provided to the reaction chamber during one or more of steps 104 and 106. In some cases, the dilution or inert or reactant gas can be continuously flowed to the reaction chamber during steps 104, 106 and loop 108.

As illustrated in FIG. 1, method 100 can include purge 110 after step 104 and/or purge 112 after step 106. Purge steps 110, 112 can be affected either in time or in space, or both. For example, in the case of temporal purges, a purge step can be used, e.g., in the temporal sequence of providing a purge gas to the reaction chamber, wherein the substrate does not move. In the case of spatial purges, a purge step can include moving a substrate from a first location, through a purge gas curtain, to a second location.

Method 100 can also include step 116 of etching the superlattice to form a superlattice feature. By way of examples, the superlattice can be etched using a reactive ion etch, such as a reactive ion etch employing a $SF_6$ or $NF_3$ plasma.

Method 100 can also include step 118 of selectively etching one or more of the first silicon-containing epitaxial layer and the second silicon-containing epitaxial layer. Step 118 can include, for example, providing an etchant, such as a chlorine-containing gas (e.g., HCl or $Cl_2$) to the reaction chamber or to another reaction chamber.

In some cases, method 100 can also include step 106 of forming a carbon (e.g., graphene) layer. Formation of the carbon layer is thought to facilitate localization of defects at an interface between the first silicon-containing epitaxial layer and the second silicon-containing epitaxial layer. The carbon layer can be formed by, for example, providing a carbon precursor and optionally a reactant to the reaction chamber. Exemplary carbon precursors include aliphatic and aromatic hydrocarbons. Examples of aliphatic hydrocarbons include alkanes such as $CH_4$ and $C_2H_6$, alkenes such as $C_2H_4$, and alkynes such as $C_2H_2$. Examples of aromatic hydrocarbons include benzene and benzene derivatives such as methylbenzene. Exemplary reactants include hydrogen $(H_2)$, hydrogen radicals, noble gas radicals, noble gas ions, carbon radicals, hydrogen ions, and carbon ions. Such radicals and ions can, for example, be generated using a plasma. Although not separately illustrated, method 100 can include a purge step after step 114 and before step 106. Further, although method 100 is illustrated with step 114 after step 104, step 114 can additionally or alternatively be performed after step 106.

Figure 2:
FIG. 2 illustrates a structure in accordance with exemplary embodiments of the disclosure.
Figure 2:
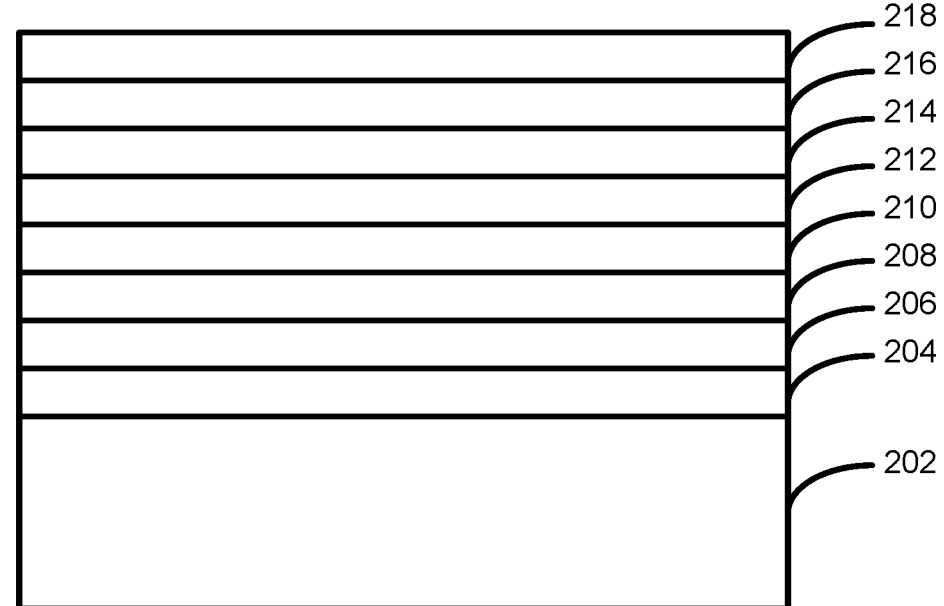

FIG. 2 illustrates a structure 200 in accordance with exemplary embodiments of the disclosure. Structure 200 can be formed using method 100. Structure 200 includes a substrate 202 and a plurality of epitaxial layers 204-218 formed overlying substrate 202. In accordance with examples of the disclosure, structure 200 includes a plurality of first or second silicon-containing epitaxial layer 204, 208, 212, and 216 alternating with a plurality of the other of first or second silicon-containing epitaxial layers 206, 210, 214, and 218. As noted above, in some cases, a structure, such as structure 200, can additionally include one or more carbon layers between a first silicon-containing epitaxial layer and a second silicon-containing epitaxial layer. Further, one or more of the first or second epitaxial layers 204-218 can include one or more dopants. In accordance with particular examples of the disclosure, one of the first or second epitaxial layers 204-218 consists essentially of silicon and the other of the first or second silicon-containing epitaxial layers consists essentially of silicon germanium.

Structure 200 can be used in the formation of three-dimensional devices, such as gate-all-around or nanowire devices.

Figure 3:
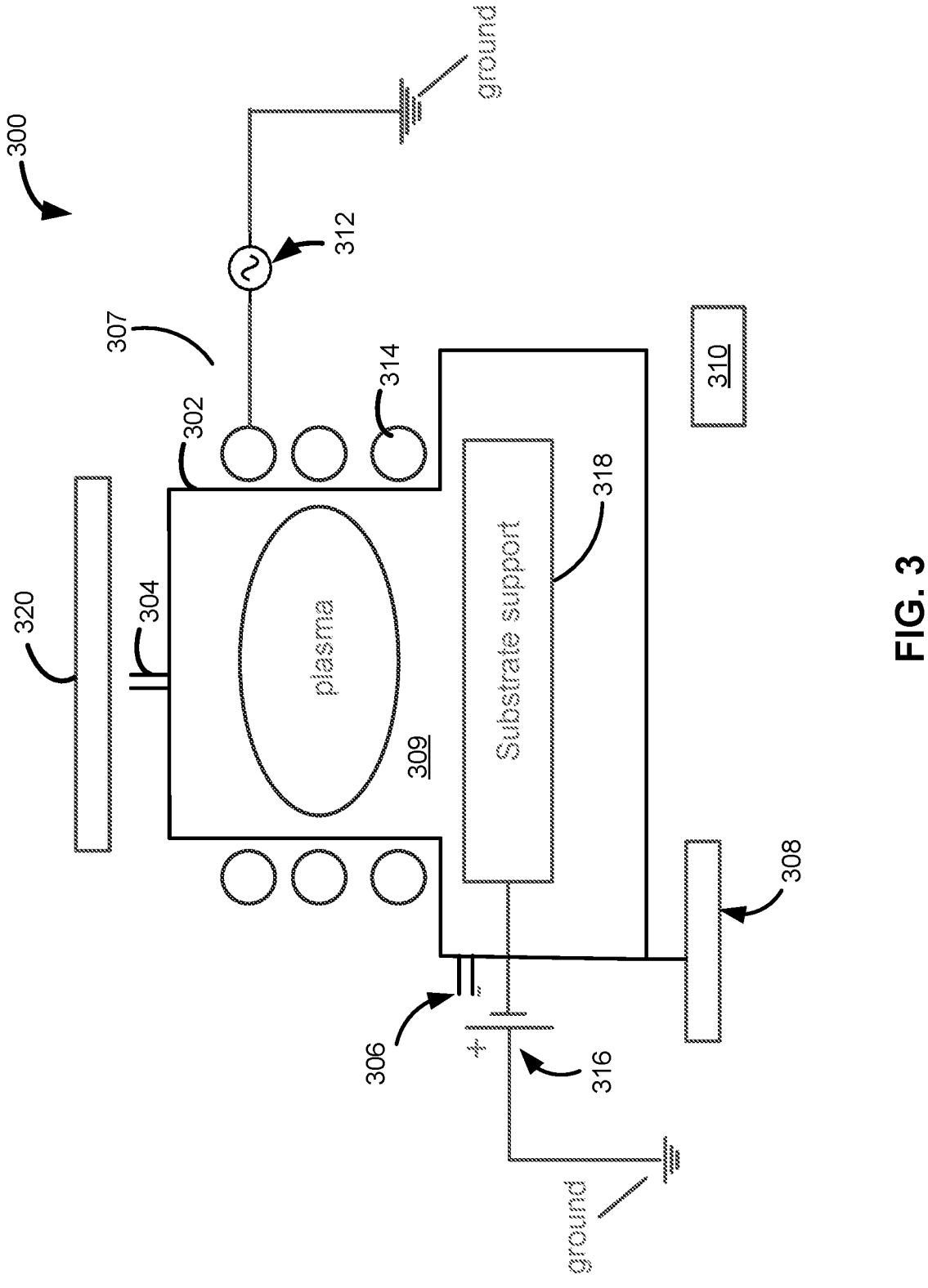
FIGS. 3 and 4 illustrate a reactor system in accordance with additional exemplary embodiments of the disclosure.
Figure 4:
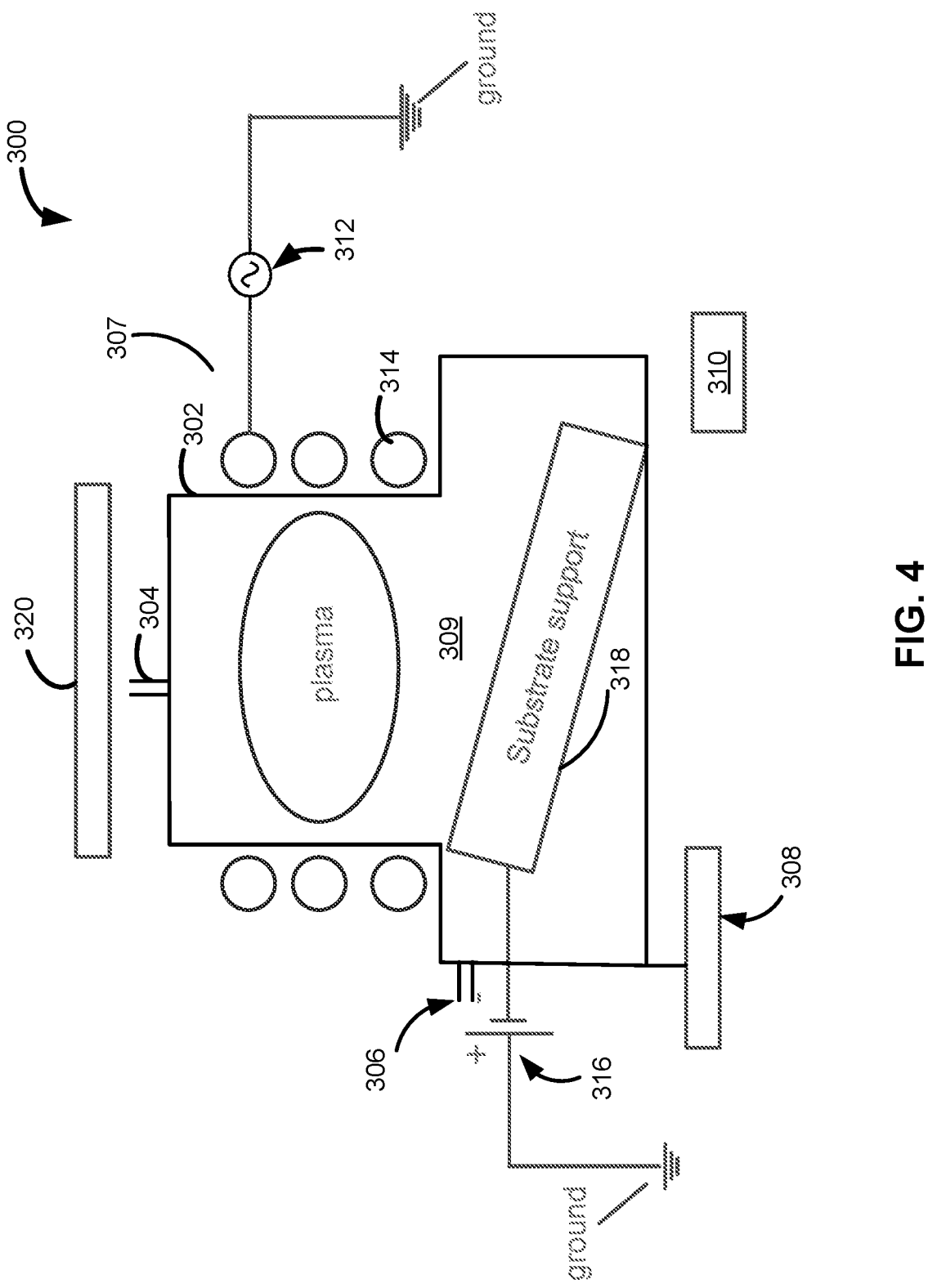

FIGS. 3 and 4 illustrate a reactor system, or simply system, 300 in accordance with yet additional exemplary embodiments of the disclosure. FIG. 3 illustrates a configuration in which nanoparticles can impinge a surface of a substrate in a perpendicular or substantially perpendicular direction. FIG. 4 illustrates a configuration of system 300, in which nanoparticles can impinge a surface of a substrate obliquely. In accordance with other examples of the disclosure, other system configurations include other configurations, such as configurations in which the plasma is formed laterally upstream of the substrate.

System 300 can be used to perform various steps of method 100. For example, system 300 can be used to perform one or more of steps 102-118, and particularly steps 102-112, and more particularly, steps 102, 104, 110, 106, 112, and 108.

In the illustrated example, system 300 includes one or more reaction chambers 302, a first gas inlet 304, and optionally a second gas inlet 306. System 300 also includes a plasma apparatus 307, an exhaust source 308, and a controller 310.

System 300 can include any suitable number of reaction chambers 302. Further, one or more reaction chambers 302 can be or include a plasma-enhanced epitaxial reaction chamber. Reaction chamber(s) 302 can be formed of any suitable material, such as quartz, aluminum oxide, silicon carbide, silicon nitride, or boron nitride. For example, reaction chamber(s) 302 can be formed of cubic boron nitride.

First gas inlet 304 can be configured to provide one or more gases to an interior space 309 of reaction chamber 302, wherein the one or more gases can be subject to plasma excitation. Second gas inlet 306 can be configured to provide one or more gases to the reaction chamber, wherein the one or more gases bypass plasma excitation.

In the illustrated example, system 300 includes an inductively-coupled plasma apparatus 307. In this case, plasma apparatus 307 includes a plasma power source 312 and a coil 314. Plasma power source 312 can provide a plasma power as described above. Although illustrated as a single power source, plasma power source 312 can include one or more generators to provide plasma power at one or more frequencies.

System 300 can also include a substrate bias power source 316. Substrate bias power source 316 is illustrated as a DC bias source. In accordance with further examples of this disclosure, substrate bias power source 316 can additionally or alternatively include an AC bias source to facilitate desired impingement on nanoparticles on a substrate on a substrate support 318. In accordance with examples of the illustrated embodiment, substrate bias power source 316 imparts a negative or net negative bias on substrate support 318.

Exhaust source 308 can include one or more vacuum pumps.

System 300 can also include one or more lamps 320 to heat substrate support 318 and/or one or more substrates thereon to a desired temperature.

Controller 310 can be configured to perform various functions and/or steps as described herein. For example, controller 310 can be configured to control gas flow into reaction chamber 302 to form a first silicon-containing epitaxial layer by providing first silicon-containing nanoparticles to a surface of the substrate, form a second silicon-containing epitaxial layer overlying the first silicon-containing epitaxial layer by providing second silicon-containing nanoparticles, and repeat the steps of forming the first silicon-containing epitaxial layer and forming the second silicon-containing epitaxial layer to form a superlattice to form a superlattice structure as described herein.

Controller 310 can include one or more microprocessors, memory elements, and/or switching elements to perform the various functions. Although illustrated as a single unit, controller 310 can alternatively comprise multiple devices. By way of examples, controller 310 can be used to control gas flow (e.g., by monitoring flow rates of precursors and/or other gases and/or controlling valves, motors, heaters, and the like). Further, when system 300 includes two or more reaction chambers, the two or more reaction chambers can be coupled to the same/shared controller.

During operation of reactor system 300, substrates, such as semiconductor wafers (not illustrated), are transferred from, e.g., a substrate handling system (not illustrated) to reaction chamber 302. Once substrate(s) are transferred to reaction chamber 302, one or more gases, such as precursors, carrier gases, etchants, and/or purge gases, are introduced into reaction chamber 302. As noted above, in at least some cases, system 300 is configured to form nanoparticles, which then deposit on a surface of a substrate to form an epitaxial layer.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements (e.g., step) described, may become apparent to those skilled in the art from the description. Such modifications and embodiments are also intended to fall within the scope of the appended claims.

The invention claimed is:

1. A method of forming a superlattice structure, the method comprising:
   providing a substrate within a reaction chamber;
   forming a first silicon-containing epitaxial layer by providing first silicon-containing nanoparticles to a surface of the substrate, wherein a substrate bias power source attracts positively charged nanoparticles of the first silicon-containing nanoparticles toward the substrate by imparting a net negative bias on a substrate support within the reaction chamber;
   forming a second silicon-containing epitaxial layer overlying the first silicon-containing epitaxial layer by providing second silicon-containing nanoparticles; and
   repeating the steps of forming the first silicon-containing epitaxial layer and forming the second silicon-containing epitaxial layer to form a superlattice,
   wherein a composition of the first silicon-containing epitaxial layer differs from a composition of the second silicon-containing epitaxial layer.

2. The method according to claim 1, wherein the step of forming the first silicon-containing epitaxial layer comprises forming an intrinsic or doped silicon layer.

3. The method according to claim 1, wherein the step of forming the second silicon-containing epitaxial layer comprises forming a layer comprising silicon germanium.

4. The method according to claim 1, wherein one of the first silicon-containing epitaxial layer and the second silicon-containing epitaxial layer can be selectively etched relative to the other of the first silicon-containing epitaxial layer and the second silicon-containing epitaxial layer.

5. The method according to claim 1, wherein the step of providing the first silicon-containing nanoparticles comprises forming the first silicon-containing nanoparticles within the reaction chamber.

6. The method according to claim 5, wherein the step of providing the first silicon-containing nanoparticles within the reaction chamber comprises a first plasma-enhanced chemical vapor deposition process.

7. The method according to claim 6, wherein the step of providing the second silicon-containing nanoparticles comprises forming the second silicon-containing nanoparticles within the reaction chamber.

8. The method according to claim 7, wherein the step of providing the second silicon-containing nanoparticles within the reaction chamber comprises a second plasma-enhanced chemical vapor deposition process.

9. The method according to claim 8, wherein one or more of the first plasma-enhanced chemical vapor deposition process or the second plasma-enhanced chemical vapor deposition process comprises forming a plasma using an inductively-coupled plasma apparatus.

10. The method according to claim 9, further comprising a purge step between the steps of forming the first silicon-containing epitaxial layer and forming the second silicon-containing epitaxial layer.

11. The method according to claim 1, wherein the substrate is biased during one or more of the steps of forming the first silicon-containing epitaxial layer and forming the second silicon-containing epitaxial layer.

12. The method according to claim 1, further comprising a step of forming a carbon-containing layer between the steps of forming the first silicon-containing epitaxial layer and forming the second silicon-containing epitaxial layer.

13. The method according to claim 12, wherein the carbon-containing layer comprises graphene.

14. The method according to claim 1, wherein one or more of the first silicon-containing epitaxial layer and the second silicon-containing epitaxial layer comprises a silicon alloy.

15. The method according to claim 1, wherein one or more of the first silicon-containing epitaxial layer and the second silicon-containing epitaxial layer comprises a dopant.

16. The method according to claim 1, wherein the substrate is heated using one or more of a susceptor heater, an infrared lamp, a process gas, and a heat exchanger.

17. The method according to claim 1, further comprising providing a localized energy to a portion of the substrate to selectively form one or more of the first silicon-containing epitaxial layer and the second silicon-containing epitaxial layer.

18. The method according to claim 1, further comprising etching the superlattice to form a superlattice feature.

19. The method according to claim 18, further comprising a step of selectively etching one of the first silicon-containing epitaxial layer and the second silicon-containing epitaxial layer.

20. The method according to claim 1, wherein the first silicon-containing epitaxial layer consists essentially of silicon and the second silicon-containing epitaxial layer consists essentially of silicon germanium.

21. A superlattice structure formed according to the method according to claim 1.

* * * * *